US009269344B2

(12) United States Patent
Pan

(10) Patent No.: US 9,269,344 B2
(45) Date of Patent: Feb. 23, 2016

(54) ENGINE HARMONIC CANCELLATION SYSTEM AFTERGLOW MITIGATION

(71) Applicant: Bose Corporation, Framingham, MA (US)

(72) Inventor: Davis Y. Pan, Arlington, MA (US)

(73) Assignee: Bose Corporation, Framingham, MA (US)

(*) Notice: Subject to any disclaimer, the term of this patent is extended or adjusted under 35 U.S.C. 154(b) by 226 days.

(21) Appl. No.: 14/016,561

(22) Filed: Sep. 3, 2013

(65) Prior Publication Data

US 2015/0063582 A1 Mar. 5, 2015

(51) Int. Cl.
*G10K 11/16* (2006.01)
*H03B 29/00* (2006.01)
*G10K 11/178* (2006.01)

(52) U.S. Cl.
CPC ........ *G10K 11/178* (2013.01); *G10K 2210/121* (2013.01); *G10K 2210/1282* (2013.01); *G10K 2210/3016* (2013.01); *G10K 2210/3035* (2013.01); *G10K 2210/3037* (2013.01); *G10K 2210/3053* (2013.01)

(58) Field of Classification Search
None
See application file for complete search history.

(56) References Cited

U.S. PATENT DOCUMENTS 4,944,018 A 7/1990 Bose et al.
5,034,984 A 7/1991 Bose
5,146,505 A * 9/1992 Pfaff et al. .................. 381/71.9
5,222,148 A * 6/1993 Yuan ............................ 381/71.9
5,321,759 A * 6/1994 Yuan ............................ 381/71.9
5,359,662 A * 10/1994 Yuan et al. ................. 381/71.14
5,386,472 A * 1/1995 Pfaff et al. ................. 381/71.12
5,434,922 A 7/1995 Miller et al.
5,485,523 A * 1/1996 Tamamura et al. .......... 381/71.4
5,615,270 A 3/1997 Miller et al.
8,194,873 B2 6/2012 Pan et al.
8,204,242 B2 6/2012 Pan et al.
8,280,073 B2 10/2012 Ganeshkumar et al.

(Continued)

FOREIGN PATENT DOCUMENTS

EP 0568128 A2 11/1993
WO 2015026568 A1 2/2015

OTHER PUBLICATIONS

Konno, Fumiyasu et al., Active Noise Control System for Engine Booming Noise, Panasonic Technical Journal, Jan. 2009, vol. 54 No. 4.

(Continued)

*Primary Examiner* — Joseph Saunders, Jr.
*Assistant Examiner* — James Mooney
(74) *Attorney, Agent, or Firm* — Brian M. Dingman; Dingman, McInnes & McLane, LLP

(57) ABSTRACT

A device and method that is configured to operate an active noise reduction system for a motor vehicle, where there is an active noise reduction system input signal that is related to the vehicle engine speed, and where the active noise reduction system comprises one or more adaptive filters that use a filter coefficient to modify the amplitude and/or phase of a noise cancellation reference signal and output noise reduction signals that are used to drive one or more transducers with their outputs directed to reduce engine noise, where the value of the coefficient is related to an adaptive filter leakage factor. Changes in the engine speed, based on the input signal that is related to the vehicle engine operation, are monitored. In response to changes in the engine speed, the adaptive filter leakage factor is temporarily modified.

17 Claims, 3 Drawing Sheets

(56) References Cited

U.S. PATENT DOCUMENTS

| | | | | |
|---|---|---|---|---|
| 8,306,240 | B2 | 11/2012 | Pan et al. | |
| 8,320,581 | B2 | 11/2012 | Hera et al. | |
| 8,335,318 | B2 | 12/2012 | Pan | |
| 8,355,512 | B2 | 1/2013 | Pan et al. | |
| 2002/0039422 | A1* | 4/2002 | Daly | 381/71.4 |
| 2007/0297619 | A1 | 12/2007 | Pan | |
| 2008/0095383 | A1 | 4/2008 | Pan et al. | |
| 2010/0098263 | A1 | 4/2010 | Pan et al. | |
| 2010/0098265 | A1* | 4/2010 | Pan et al. | 381/94.1 |
| 2010/0239105 | A1 | 9/2010 | Pan | |
| 2012/0177214 | A1 | 7/2012 | Hera et al. | |
| 2012/0308023 | A1* | 12/2012 | Luecking et al. | 381/71.5 |
| 2015/0055787 | A1* | 2/2015 | Ganeshkumar | 381/71.1 |

OTHER PUBLICATIONS

Hakansson, L., The Filtered-x LMS Algorithm Department of Telecommunications and Signal Processing, University of Karlskrona/Ronneby 372 25 Ronneby, Sweden.

Pending U.S. Appl. No. 13/796,644, filed Mar. 12, 2013; Pan, Davis Y.

Pending U.S. Appl. No. 13/853,265, filed Mar. 29, 2013; Pan, Davis Y.

The International Search Report and the Written Opinion of the International Searching Authority issued on Mar. 30, 2015 for corresponding PCT Application No. PCT/US2014/050681.

* cited by examiner

ENGINE HARMONIC CANCELLATION SYSTEM AFTERGLOW MITIGATION

FIELD

This disclosure relates to the active reduction of engine noise in a motor vehicle.

BACKGROUND

Engine harmonic cancellation (EHC) systems are active noise reduction systems that are used in motor vehicles, for example in cabins or in muffler assemblies, to reduce or cancel engine harmonic noise. EHC systems use one or more microphones as input transducers. A signal related to the noise to be canceled is also inputted to an adaptive filter. The output of the adaptive filter is applied to one or more transducers that produce sound (i.e., loudspeakers). The sound is acoustically opposite to the undesirable engine sounds that are to be canceled. The adaptive filter can alter the magnitude and/or the phase of the input signal. The aim of the system is to cancel the microphone signal at the frequency or frequencies of the sinusoidal engine noise by using the sound transducers to output sinusoids of the same frequencies and amplitudes but opposite (180 degree offset) phase.

In certain situations these EHC systems can cause the loudspeaker sound output levels that are designed to cancel the engine noise to be greater than the level of the noise to be cancelled. This can cause an audible noise artifact (also called "afterglow"), which is undesirable. Afterglow can occur when there is a sudden decrease in the engine load (e.g., when there is a transmission up shift or down shift) and a resulting sudden decrease in the engine noise level in the cabin that occurs while the EHC output briefly remains at the sound pressure level it was at before the noise decreased. The EHC system must readapt to the new, lower engine noise level to resume its noise cancellation and this process is often slower than necessary to avoid a temporary noise gain.

SUMMARY

The system, device and method of this disclosure are effective to minimize or eliminate audible artifacts due to the EHC output level remaining high when the engine noise level suddenly decreases, which typically happens when an automatic transmission up shifts or when the clutch of a manual transmission is pushed in. The rapid reduction of EHC output in these cases can be accomplished by decreasing the value of the adaptive filter leakage factor when the engine RPM suddenly decreases. As a result, when the engine noise suddenly drops the engine harmonic cancellation system output tone drops as well so that the overall noise remains low.

All examples and features mentioned below can be combined in any technically possible way.

In one aspect, a method that is configured to operate an active noise reduction system for a motor vehicle, where there is an active noise reduction system input signal that is related to the vehicle engine speed, for example the RPM, and where the active noise reduction system comprises one or more adaptive filters that use a filter coefficient to modify the amplitude and/or phase of a noise cancellation reference signal and output noise reduction signals that are used to drive one or more transducers with their outputs directed to reduce engine noise, where the value of the coefficient is related to an adaptive filter leakage factor, includes monitoring changes in the engine speed based on the input signal that is related to the vehicle engine operation, and in response to changes in the engine speed, temporarily modifying the value of the adaptive filter leakage factor.

Embodiments may include one of the following features, or any combination thereof. The leakage factor may be decreased in response to a decrease in the engine speed. The leakage factor may be reduced to zero in response to a decrease in the engine speed. The leakage factor may be decreased only after the decrease in the engine speed exceeds a threshold decrease in engine speed over a given period of time. The leakage factor may be reduced at least until an output is below an estimated level of engine noise. The level of engine noise may be estimated from the engine load. The level of engine noise may be estimated from the engine torque. The level of engine noise may be estimated based on a comparison of the engine operation to previously measured noise levels at different engine operations.

Embodiments may include one of the following additional features, or any combination thereof. The leakage factor may be modified for an amount of time, which may be variable. The amount of time may be dependent on the change in engine operation. The method may further comprise monitoring changes in the engine load, and wherein the adaptive filter leakage factor is modified based on changes to one or both of the engine speed and the engine load. The value of the adaptive filter coefficient can be further related to an adaptive filter adaptation rate, and where in response to changes in engine speed the adaptation rate is modified. The adaptation rate may either be modified only after the leakage factor is decreased, or the adaptation rate modification may be independent of the leakage factor. The modification of the adaptation rate may occur temporarily. In response to changes in engine speed, one or both of the adaptation rate and the leakage factor may be modified, where one or both of the amount of such modification and the duration of such modification are dependent on whether the engine speed increases or decreases, the extent of such increase or decrease, and/or the duration of such increase or decrease.

In another aspect, a method for operating an active noise reduction system for a motor vehicle, where there is an active noise reduction system input signal that is related to the vehicle engine speed, and where the active noise reduction system comprises one or more adaptive filters that use a filter coefficient to modify the amplitude and/or phase of a noise cancellation reference signal and output noise reduction signals that are used to drive one or more transducers with their outputs directed to reduce engine noise, where the value of the coefficient is related to an adaptive filter leakage factor, includes monitoring changes in the engine speed based on the input signal that is related to the vehicle engine operation, and in response to changes in the engine speed, modifying (e.g., reducing) the adaptive filter leakage factor, wherein the adaptive filter leakage factor is modified only after the change in the engine speed exceeds a threshold change in engine speed over a given period of time, wherein the adaptive filter leakage factor is modified at least until an output is below an estimated level of engine noise and wherein the level of engine noise is estimated from the engine load.

Embodiments may include one of the following features, or any combination thereof. The leakage factor may be reduced to zero in response to a decrease in the engine speed. The value of the adaptive filter coefficient may be further related to an adaptive filter adaptation rate, and where in response to changes in engine speed, the adaptation rate is temporarily modified. In response to changes in engine speed, one or both of the adaptation rate and the leakage factor may be modified, where one or both of the amount of such modification and the duration of such modification are dependent on whether the engine speed increases or decreases, the extent of such increase or decrease, and/or the duration of such increase or decrease.

In another aspect, a device configured to control the operation of an active noise reduction system for a motor vehicle, where there is an active noise reduction system input signal that is related to the vehicle engine speed, and where the active noise reduction system comprises one or more adaptive filters that use a filter coefficient to modify the amplitude and/or phase of a noise cancellation reference signal and output noise reduction signals that are used to drive one or more transducers with their outputs directed to reduce engine noise, where the value of the coefficient is related to an adaptive filter leakage factor, includes a processor that is configured to monitor changes in the engine speed based on the input signal that is related to the vehicle engine operation, and in response to changes in the engine speed, modify the adaptive filter leakage factor.

DETAILED DESCRIPTION

Figure 1:
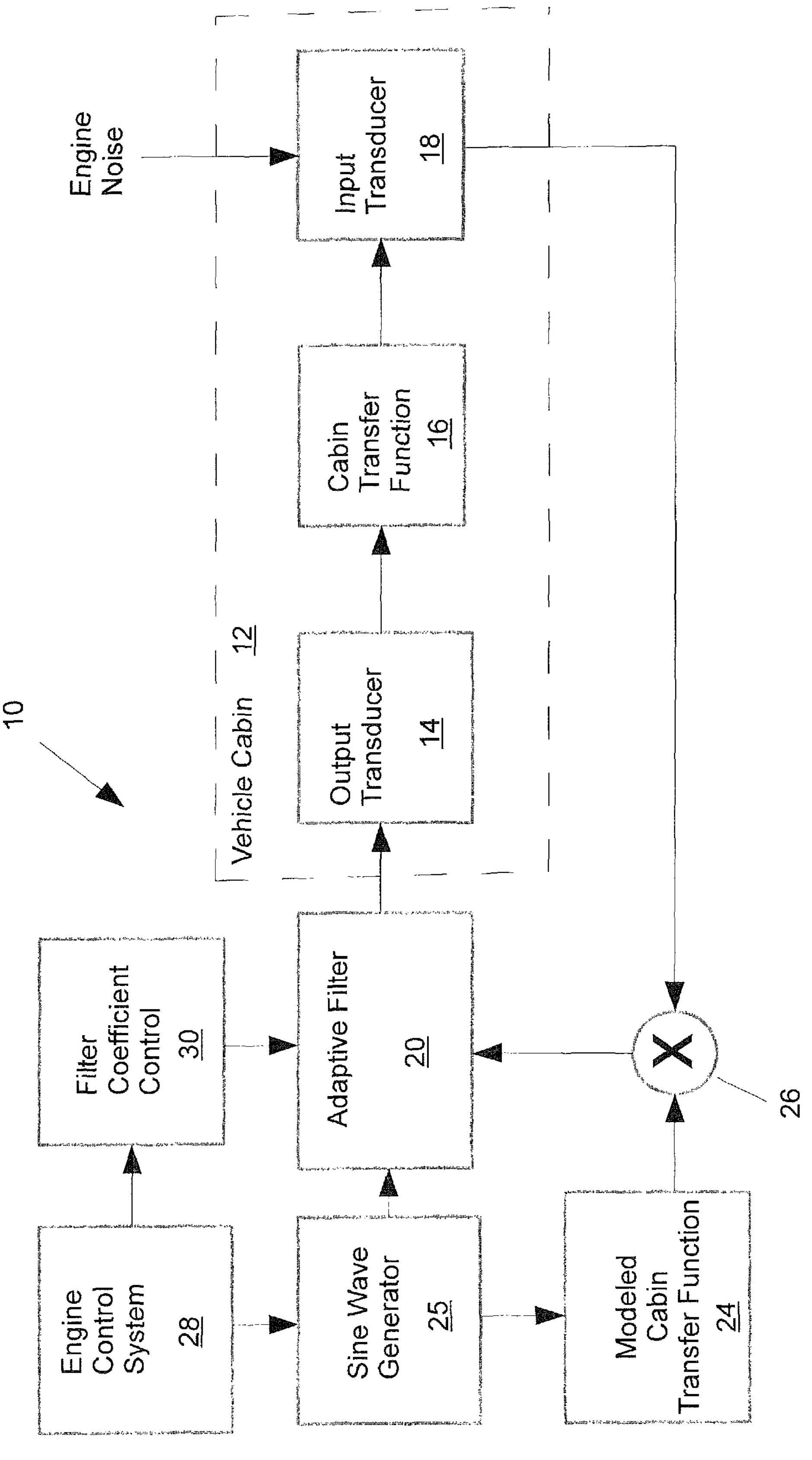
FIG. 1 is a schematic block diagram of an engine harmonic cancellation system that can be used to accomplish the system, device and method of the present innovation.

Elements of FIG. 1 of the drawings are shown and described as discrete elements in a block diagram. These may be implemented as one or more of analog circuitry or digital circuitry. Alternatively, or additionally, they may be implemented with one or more microprocessors executing software instructions; the adaptive filter may be accomplished with a processor such as a digital signal processor. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

FIG. 1 is a simplified schematic diagram of an engine harmonic cancellation system 10 that embodies the disclosed innovation. System 10 uses adaptive filter 20 that supplies signals to one or more output transducers 14 that have their outputs directed into vehicle cabin 12. The output of the transducers, as modified by the cabin transfer function 16, is picked up by an input transducer (e.g., microphone) 18. Engine noise in the vehicle cabin is also picked up by input transducer 18. Existing vehicle engine control system 28 supplies one or more input signals that are related to the vehicle engine operation. Examples include RPM, torque, accelerator pedal position, and manifold absolute pressure (MAP). An adaptive filter coefficient control 30 is input with the signal(s) from engine control system 28 that relate to vehicle engine operation, including but not necessarily limited to the engine RPM. As further explained below, controller 30 modifies the leakage factor of adaptive filter 20 in response to changes in engine RPM.

Sine wave generator 25 provides to adaptive filter 20 a noise reduction reference signal that includes the harmonics of the engine frequency that are to be cancelled using adaptive filter 20. Adaptive filter 20 comprises a processor. The output of sine wave generator 25, which is referred to as the "x signal," is also provided to modeled cabin transfer function 24, to produce a filtered x signal. The filtered x signal and the microphone output signals are multiplied together 26, and provided as a control input to adaptive filter 20. The operation of adaptive feed-forward harmonic noise cancellation systems is well understood by those skilled in the art. In the present case in which a filtered x adaptive algorithm is used, variables of the algorithm coefficients include the adaptation rate and the leakage. Adaptation rate and leakage in an adaptive algorithm are disclosed in U.S. Pat. Nos. 8,194,873; 8,204,242; 8,355,512; and 8,306,240, the disclosures of which are incorporated herein by reference.

Filter coefficient control 30 provides to adaptive filter 20 signals that are effective to limit the output of transducer 14 based on changes of the engine RPM. A result is that the system is configured to output a level of sound that is no greater than the estimated level of engine noise in vehicle cabin 12. Controller 30 can accomplish this goal by causing adaptive filter 20 to modify at least the leakage factor of the algorithm in response to changes in engine RPM. Controller 30 can also cause modifications of the filter's adaptation rate.

The value of the adaptive filter coefficient is directly related to the filter's leakage factor. If the leakage factor's value is reduced, the coefficient is reduced for each iteration of the filter adaptation and the level of the EHC output tone is reduced. Since the adaptive filter takes a finite amount of time to change the EHC output tone, changes to the adaptive filter output may lag sudden changes to the engine noise. This lag can be reduced by directly controlling the EHC output based on signals received from the engine control system. Engine speed (e.g., revolutions per minute or RPM) is an indicator of the amplitude of engine noise. If the engine speed changes suddenly, the engine noise will change suddenly. The noise level can drop faster than the adaptive filter, in its normal operation, can lower the level of the EHC output tone. If this happens the EHC output will momentarily be louder than the engine noise, creating a human-perceptible noise artifact termed "afterglow."

System 10 can reduce or eliminate afterglow by causing adaptive filter 20 to reduce the level of the EHC output tone based on sudden RPM changes that are received via engine control system 30. This way the EHC system can react faster than it would in normal feed-forward operation. The level of the EHC output tone can be quickly reduced by using controller 30 to cause adaptive filter 20 to reduce its leakage factor. In one non-limiting example, the leakage can be reduced to zero so that the level of the EHC output tone drops as quickly as possible. The reduction in leakage can continue until the EHC output tone level is no greater than the estimated engine noise level in the location in which noise is being cancelled (e.g., the vehicle cabin). When this situation is achieved, the filter operation can be returned to normal.

Engine RPM will normally vary while the motor vehicle is in operation. System 10 should account for this so as not to cause EHC output changes that are not warranted. Thus, controller 30 can be adapted to cause the leakage factor to change only when the engine RPM changes quickly. For example, a change of at least a threshold absolute or relative amount over a predetermined period of time can be indicative of a "sudden" change in RPM that needs to be counteracted via controller 30. As a specific non-limiting example, consider the RPM of an engine when its transmission up shifts from $3^{rd}$ gear to $4^{th}$ gear. In $3^{rd}$ gear at 60 mph, the engine will have an RPM of about 3500. After an up shift to $4^{th}$ gear, the RPM will drop to 2600 RPM. The sudden drop of 900 RPM in a fraction of a second is a strong indication of a transmission up shift and a significant temporary drop in the engine noise level.

One result of the subject innovation is a reduction or elimination of human-detectable noise artifacts due to the cancellation system output slightly lagging cabin engine noise reductions due to sudden changes in engine RPM.

Figure 2:
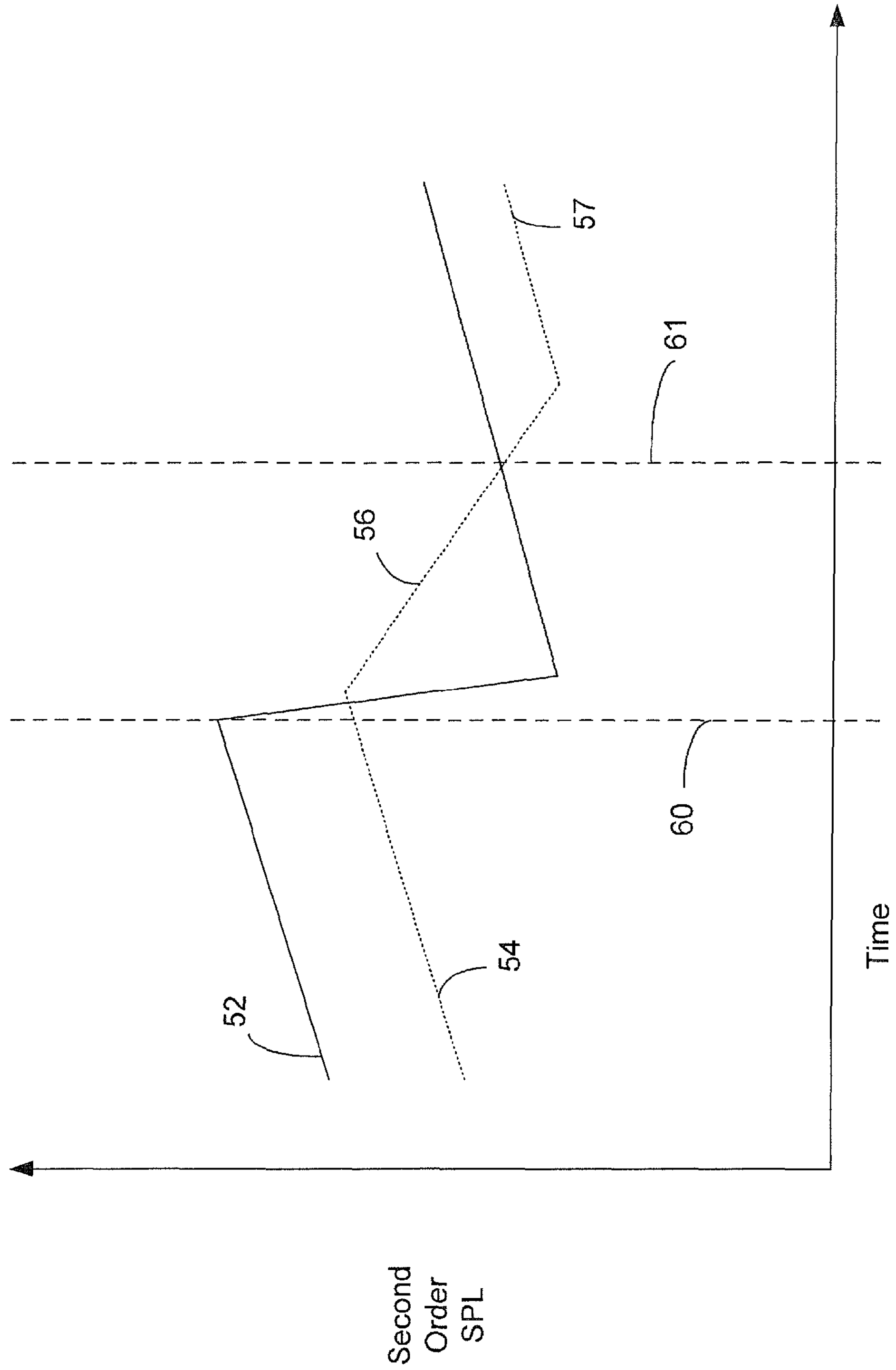
FIG. 2 illustrates engine harmonic cancellation system afterglow.

A non-limiting example of a manner in which the innovation can operate is illustrated with reference to FIGS. 2 and 3. FIG. 2 illustrates afterglow. Second order sound pressure level (SPL) of engine noise in a vehicle cabin is illustrated by plot 52 (solid line). At time 60 the engine noise drops quickly due to a sudden release of the accelerator pedal, or potentially due to other actions such as a transmission up-shift. EHC system output is illustrated by plot 54 (dashed line). Before time 60 the EHC output is normal and follows the engine noise. However, just after time 60 and until time 61 the EHC output (area 56 of plot 54) is greater than the engine noise: this is afterglow. The EHC system will eventually self-correct and return to normal levels, as shown by area 57 of plot 54.

Figure 3:
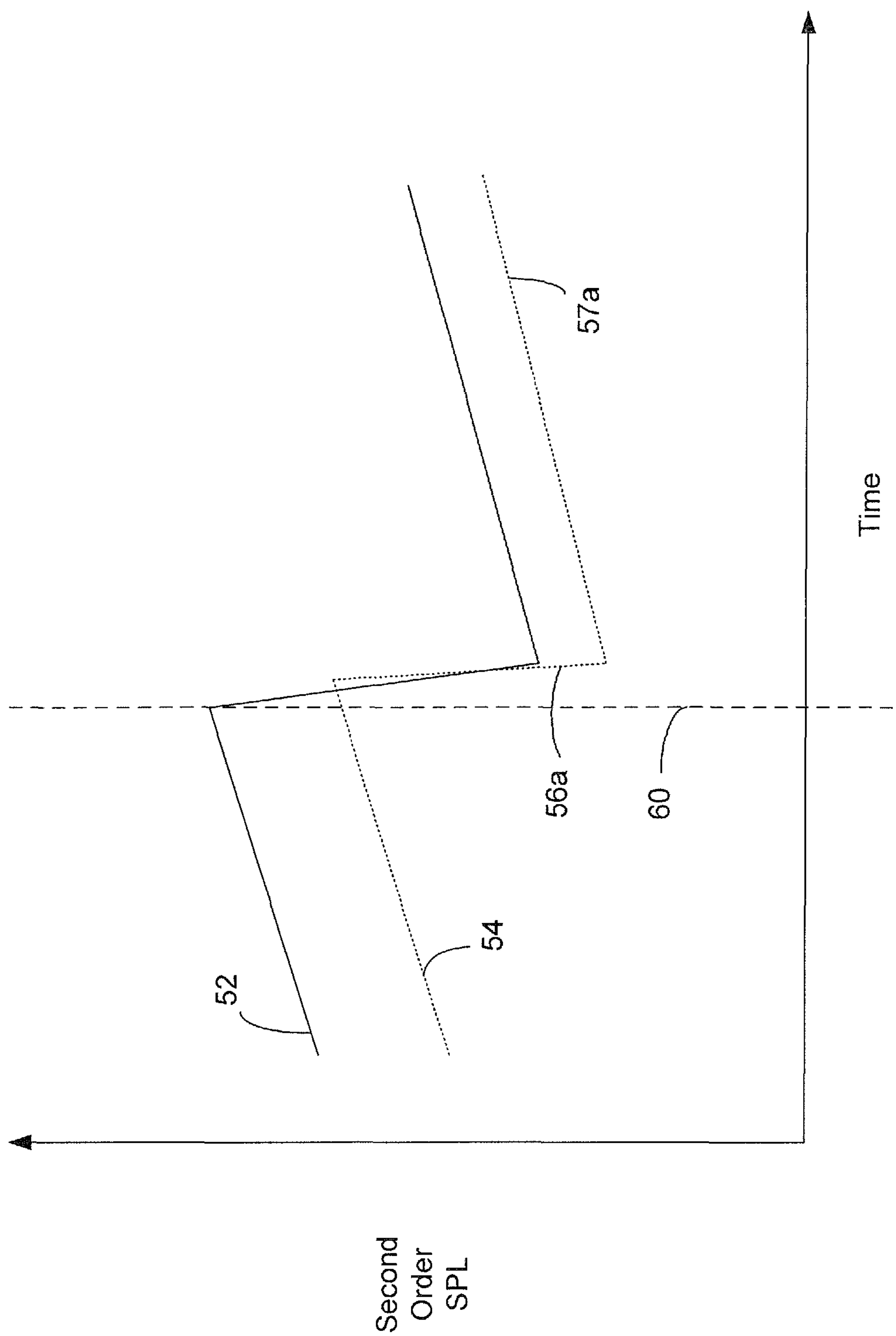
FIG. 3 illustrates the mitigation of engine harmonic cancellation system afterglow.

FIG. 3 illustrates operation of system 10 where controller 30 causes the adaptive filter leakage factor to be reduced so as to decrease the level of the EHC tone more quickly. EHC output curve 54 in area 56*a* just after time 60 now drops quickly, so quickly that the afterglow is reduced or eliminated. Normal operation returns more quickly as well, as indicated by area 57*a* of curve 54. As long as system 10 is able to cause the EHC tone level to drop below the engine noise in less than the perceptual limits of human hearing there will be little or no noticeable afterglow.

EHC output tone level can be most quickly reduced by causing the leakage factor value to reduce to zero. However, it is desirable for the EHC system to return to normal operation quickly rather than for the leakage to remain at zero, or remain artificially depressed for too long. Operation can be returned to normal (as indicted by area 57*a* of plot 54) as follows. One manner is to use controller 30 to reduce leakage only until the level of the EHC tone is lower than that of the engine noise. Engine noise can be measured with a transducer. If the actual noise level is not known, engine noise can be estimated. One manner in which engine noise can be estimated can be based on signal(s) from engine control system 28 that are indicative of engine noise. One such signal could be the torque; controller 30 could estimate engine noise from a torque signal, and cease artificially depressing leakage once the EHC output was at or below this estimate. When cancelling, the SPL of the EHC output approximately matches the SPL of the targeted engine noise. The SPL drop as a function of leakage factor and time can be approximated. Thus if the drop in engine noise SPL due to an upshift is known, the amount and duration of the required leakage factor can be computed and used by system 10. An alternative could be that the engine noise at various operating conditions (e. g., at various RPMs and engine loads) could be measured during system design (e.g., when the EHC system was tuned for the particular model of motor vehicle) and recorded. These values could be stored in a memory associated with system 10. This memory could be queried during operation for comparison to current engine operating conditions, as a manner to estimate engine noise and compare the EHC output to this estimate.

The adaptive filter adaptation rate affects how quickly the EHC output responds to changes. Returning EHC operation back to normal, in which the output is effective to cancel engine noise, can also be sped up by causing the adaptation rate to increase. The increase could be accomplished by controller 30. Any such increase should desirably be temporary, just long enough for the EHC system to return to normal operation. Such increases would be typically occur once the EHC output was below the targeted engine level, and would continue until the EHC system was restored to normal cancellation operation. Since the adaptation rate determines how quickly the adaptive filter 20 adjusts its output to the targeted engine noise level, the controller 30 can temporarily increase the adaptation rate by a tuned amount for a predetermined and tuned amount of time so that adaptation is accelerated to its optimal noise cancellation state.

Controller 30 can also respond to increases in engine speed. A sudden increase in RPM may cause a sudden increase in engine noise SPL. The EHC system may lag this increase, which would cause the engine noise heard by an occupant to temporarily increase. The EHC system lag can be minimized or effectively eliminated by using controller 30 to cause a temporary change to the leakage factor, and adaptation rate if desired, upon the detection of an increase in RPM of at least a given amount over no more than a given time period. For example, in a reverse of the previous example, during a transmission down shift from $4^{th}$ gear to $3^{rd}$ gear, the engine RPM will increase from 2600 to 3500 RPM. For a very brief time during the down shift, the engine load will drop as the transmission disengages in order to change gears. During this time, the engine noise level will drop, thus it is beneficial to drop the leakage factor to quickly reduce EHC output. After the EHC output is at or below the targeted engine noise level, it is beneficial to temporarily increase the adaptation rate (by a tuned amount, say two times, over a tuned amount of time, for example 50 ms) so that the EHC cancellation performance is restored as quickly as possible. Since the engine noise behavior is different between up shifts and down shifts, it is beneficial for the controller 30 to distinguish between large positive and large negative RPM changes when determining the leakage factors and adaptation rates.

More generally, the amount of leakage reduction and/or the amount of adaptation rate increase, and/or the duration of such modification(s), can be specified depending on the rapidity of the change in engine speed, and whether the change is an increase or a decrease in engine speed. For example, the amount and duration of the drop in engine noise is different depending on whether the transmission up shifts or down shifts, so the tunable filter parameters should accommodate the differences. The adaptation rate and/or the leakage factor can be modified. One or both of the amount of such modification and the duration of such modification can be dependent on whether the engine speed increases or decreases, the extent of such increase or decrease, and/or the duration of such increase or decrease.

The above was described relative to noise cancellation in a vehicle cabin. However, the disclosure applies as well to noise cancellation in other vehicle locations. One additional example is that the system can be designed to cancel noise in a muffler assembly. Such noise may be engine harmonic noise but may also be other engine-operation related noise (e.g., an air conditioner compressor), as is known in the art.

Embodiments of the devices, systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

The various features of the disclosure could be enabled in different manners than those described herein, and could be combined in manners other than those described herein. A number of implementations have been described. Nevertheless, it will be understood that additional modifications may be made without departing from the scope of the inventive concepts described herein, and, accordingly, other embodiments are within the scope of the following claims.

What is claimed is:

1. A method for operating an active noise reduction system for a motor vehicle, where there is an active noise reduction system input signal that is related to the vehicle engine operation, and where the active noise reduction system comprises one or more adaptive filters that use a filter coefficient to modify the amplitude and/or phase of a noise cancellation reference signal and output noise reduction signals that are used to drive one or more transducers with their outputs directed to reduce engine noise, where the value of the coefficient is related to an adaptive filter leakage factor, the method comprising:

monitoring changes in the engine speed based on the input signal that is related to the vehicle engine operation; and in response to changes in the engine speed, modifying the adaptive filter leakage factor;

wherein the adaptive filter leakage factor is reduced to zero in response to a decrease in the engine speed.

2. The method of claim 1 wherein the adaptive filter leakage factor is reduced only after the decrease in the engine speed exceeds a threshold decrease in engine speed over a given period of time.

3. The method of claim 1 wherein the adaptive filter leakage factor is reduced at least until an output is below an estimated level of engine noise.

4. The method of claim 3 wherein the level of engine noise is estimated from the engine load.

5. The method of claim 3 wherein the level of engine noise is estimated from the engine torque.

6. The method of claim 3 wherein the level of engine noise is estimated based on a comparison of the engine operation to previously measured noise levels at different engine operations.

7. The method of claim 1 wherein the adaptive filter leakage factor is modified for an amount of time.

8. The method of claim 7 wherein the amount of time is variable.

9. The method of claim 8 wherein the amount of time is dependent on the change in engine operation.

10. The method of claim 1 further comprising monitoring changes in the engine load, and wherein the adaptive filter leakage factor is modified based on changes to one or both of the engine speed and the engine load.

11. The method of claim 1 where the value of the adaptive filter coefficient is further related to an adaptive filter adaptation rate, and where in response to changes in engine speed, the adaptation rate is modified.

12. The method of claim 11 wherein the modification of the adaptation rate occurs temporarily.

13. The method of claim 11 wherein, in response to changes in engine speed, one or both of the adaptation rate and the leakage factor are modified, where one or both of the amount of such modification and the duration of such modification are dependent on whether the engine speed increases or decreases, the extent of such increase or decrease, and/or the duration of such increase or decrease.

14. A method for operating an active noise reduction system for a motor vehicle, where there is an active noise reduction system input signal that is related to the vehicle engine operation, and where the active noise reduction system comprises one or more adaptive filters that use a filter coefficient to modify the amplitude and/or phase of a noise cancellation reference signal and output noise reduction signals that are used to drive one or more transducers with their outputs directed to reduce engine noise, where the value of the coefficient is related to an adaptive filter leakage factor, the method comprising:

monitoring changes in the engine speed based on the input signal that is related to the vehicle engine operation; and in response to changes in the engine speed, decreasing the adaptive filter leakage factor, wherein the adaptive filter leakage factor is decreased only after the change in the engine speed exceeds a threshold change in engine speed over a given period of time, wherein the adaptive filter leakage factor is reduced to zero in response to a decrease in the engine speed, and wherein the adaptive filter leakage factor is reduced at least until an output is below an estimated level of engine noise and wherein the level of engine noise is estimated from the engine load.

15. The method of claim 14 where the value of the adaptive filter coefficient is further related to an adaptive filter adaptation rate, and where in response to changes in engine speed, the adaptation rate is temporarily modified.

16. The method of claim 15 wherein, in response to changes in engine speed, one or both of the adaptation rate and the leakage factor are modified, where one or both of the amount of such modification and the duration of such modification are dependent on whether the engine speed increases or decreases, the extent of such increase or decrease, and/or the duration of such increase or decrease.

17. A device configured to control the operation of an active noise reduction system for a motor vehicle, where there is an active noise reduction system input signal that is related to the vehicle engine operation, and where the active noise reduction system comprises one or more adaptive filters that use a filter coefficient to modify the amplitude and/or phase of a noise cancellation reference signal and output noise reduction signals that are used to drive one or more transducers with their outputs directed to reduce engine noise, where the value of the coefficient is related to an adaptive filter leakage factor, the device comprising:

a processor that is configured to:

monitor changes in the engine speed based on the input signal that is related to the vehicle engine operation; and in response to changes in the engine speed, modify the adaptive filter leakage factor, wherein the adaptive filter leakage factor is reduced to zero in response to a decrease in the engine speed.

* * * * *